United States Patent [19]

Lund et al.

[11] 4,319,395

[45] Mar. 16, 1982

[54] METHOD OF MAKING SELF-ALIGNED DEVICE

[75] Inventors: Clarence A. Lund; Edward W. Barron, both of Mesa; Howard E. Holstin, Tempe; Michael D. Sugino, Scottsdale, all of Ariz.

[73] Assignee: Motorola, Inc., Schaumburg, Ill.

[21] Appl. No.: 53,132

[22] Filed: Jun. 28, 1979

[51] Int. Cl.³ ............... H01L 21/306; H01L 21/441
[52] U.S. Cl. ........................ 29/571; 29/579; 29/591; 156/657; 156/662; 357/23
[58] Field of Search ............. 29/571, 576 B, 578, 29/579, 591; 156/657, 662, 628; 357/23, 91

[56] References Cited

U.S. PATENT DOCUMENTS 4,033,797 7/1977 Dill et al. .................. 148/187
4,141,022 2/1979 Sigg et al. .................. 357/23
4,182,023 1/1980 Cohen .................. 29/571

Primary Examiner—Aaron Weisstuch
Attorney, Agent, or Firm—John A. Fisher

[57] ABSTRACT

A self-aligned MOS transistor having improved operating characteristics and higher packing density and a method for fabricating the device. Resistance of the gate electrode is reduced substantially by forming the electrode of a metal silicide. Resistance of the source and drain regions is likewise reduced substantially by forming a metal silicide in the doped junction region which allows those regions to be smaller and to require less area. The silicided source and drain regions are self-aligned with and closely spaced to the silicided gate electrode. This is provided by a process which utilizes and makes possible an undercut etching of a polycrystalline silicon gate electrode.

9 Claims, 14 Drawing Figures

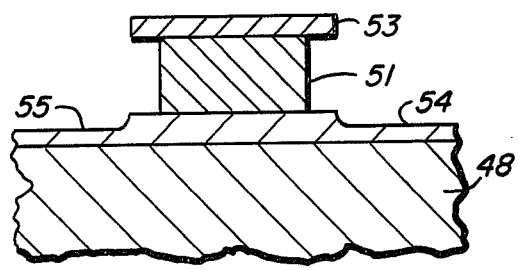
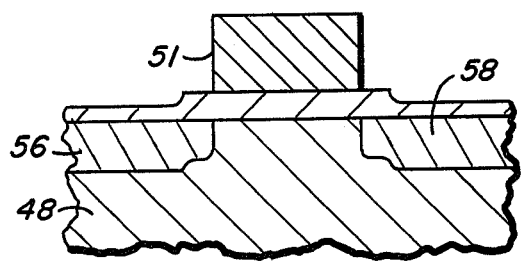
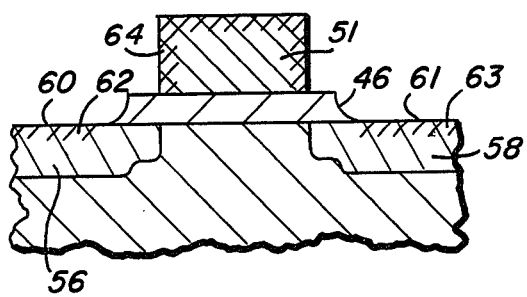
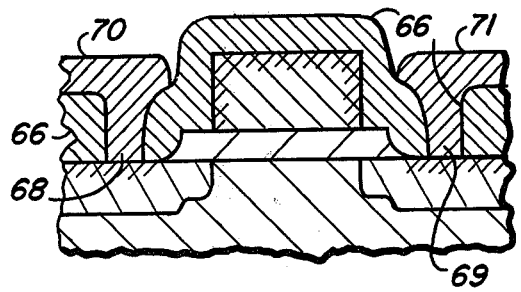
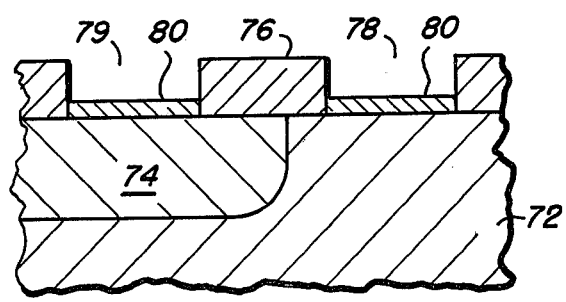

METHOD OF MAKING SELF-ALIGNED DEVICE

BACKGROUND OF THE INVENTION

This invention relates to an improved semiconductor device and method for fabricating that device, and more particularly to an insulated gate field effect transistor having a metal silicide gate electrode and self-aligned metal silicide contacts to the source and drain regions.

A widely used insulated gate field effect transistor (IGFET) utilizes a doped polycrystalline silicon region as a gate electrode. In many applications such a silicon gate IGFET is totally adequate but in certain applications, particularly high performance circuits and those circuits using a large array of such transistors, the resistance along the doped polycrystalline silicon can be a factor limiting the performance of the circuit. In a particular configuration, for example, a number of such polycrystalline silicon gates may be tied together by a polycrystalline silicon interconnection to form a word line. The speed with which that word line can be charged and discharged can be limited by the RC time constant associated with that line. The time constant, in turn, is directly proportional to the resistance of the polycrystalline silicon line. High resistance polycrystalline silicon thus leads to a large time constant and limits circuit performance. A further limitation of the performance of prior art IGFET circuits is the area occupied by each individual transistor. Large area devices lead to circuits having a large total area which are difficult to fabricate with an acceptable yield. Large devices also imply large junction area and the large junction area results in a large junction capacitance which must be charged and discharged as the circuit functions. The large junction capacitance in turn leads, again, to degraded circuit performance.

The conventional silicon gate IGFET process results in large devices for reasons which are at least indirectly related to the lack of a totally self-aligned process. In the standard process, lateral misalignment of the gate electrode with respect to the diffused source and drain regions can result in one of the regions being narrower than the design width. The resistance along this narrower than designed region can be intolerably high and can lead, because of distributed resistance effects, to the inoperation of the extremities of the device. To overcome this effect the diffused regions must be designed overly large so that even in the event of a misalignment the resistance will not be too high to limit operation of the device. This results in overly large devices. A further solution for overcoming this problem is to very heavily dope the diffused source and drain regions to increase their conductivity. But there are two potential problems with this solution. First, the heavily doped region may have undesirable breakdown characteristics or undesirable minority carrier lifetime characteristics associated therewith because of the degeneracy required of the region. Secondly, if the regions are doped by ion implantation, the heavy doping may require too long an implant time since implant dose is directly proportional to time. A still further solution involves metallizing the source and drain regions. This solution too, however, is unworkable since it requires contact openings to the source and drain regions, and thus requires the alignment of these contact openings and the metal itself with respect to the gate electrode. Tolerances associated with these two alignment steps require the useage of too much surface area on the integrated circuit chip.

Accordingly, it is apparent that a need existed in the semiconductor industry for an improved device and method of fabrication, especially in the high performance or high density applications of semiconductor devices. This need cannot be met by any of the processes or designs heretofore existing.

Therefore, it is an object of this invention to provide a device and a method of fabricating that device which is capable of increased performance and increased packing density.

It is a further object of this invention to provide an improved device and self-aligned method for fabricating that device.

It is a still further object of this invention to provide a self-aligned process for fabricating a device having a high conductivity gate electrode and high conductivity source and drain electrodes.

It is another object of this invention to provide a high yielding device fabrication process that uses reduced levels of ion implantation.

It is still another object of this invention to provide a high density process for fabricating smaller, more compact devices.

SUMMARY OF THE INVENTION

The foregoing objects are achieved in the present invention wherein the patterned gate electrode is used as a mask to thin the exposed insulator overlying source and drain contact areas and is subsequently used, at reduced width, as the doping mask for forming the doped source and drain regions. Subsequent formation of spaced apart silicide contacts is facilitated by remaining portions of the insulating layer protruding from under the reduced width gate.

BRIEF DESCRIPTION OF THE DRAWINGS

Other objects and advantages of the invention will become apparent upon reading the following detailed description and upon reference to the drawings in which:

FIGS. 2-8 depict in cross-section the steps employed in fabricating a device in accordance with the invention; and FIGS. 9-14 depict in cross-section the fabrication steps for fabricating complementary IGFET devices in accordance with the invention.

DETAILED DESCRIPTION OF THE PREFERRED EMBODIMENTS

Figure 1:
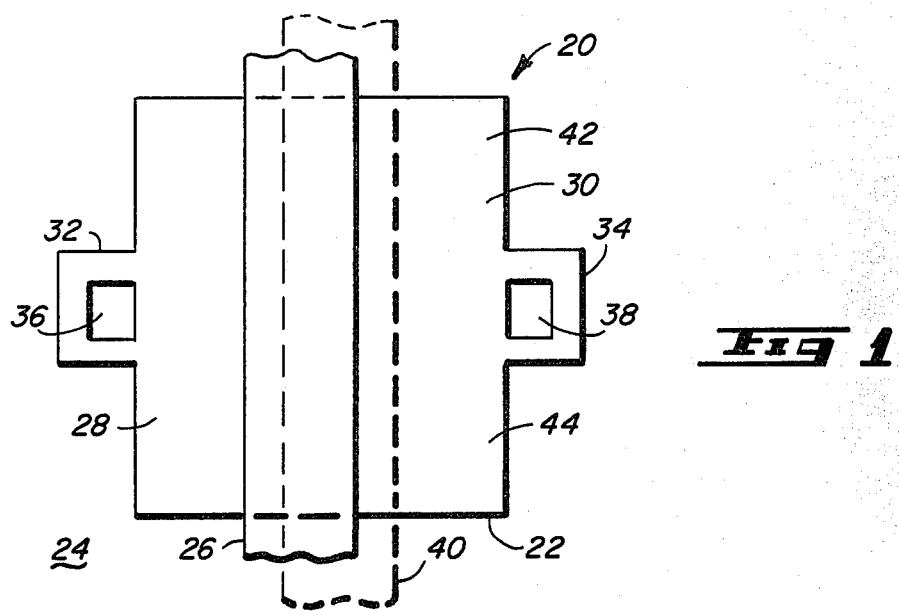
FIG. 1 shows schematically the layout of a typical IGFET integrated circuit device.

FIG. 1 depicts the layout of a typical silicon gate IGFET 20. The active area of the device is defined by the line 22. Outside this line will be a thick field oxide 24 which isolates that device from an adjacent device. A silicon gate electrode 26 crosses the active area and divides that active area into device regions 28, 30 typically designated as the source and drain regions. The tabs 32, 34 extending outwardly from the source and drain regions provide space in which contact is eventually made to the diffused source and drain regions through contact openings 36, 38. A problem can arise with this device if the gate electrode 26 is misaligned during the fabrication sequence and is instead positioned as shown by dotted line 40. With the gate shown as positioned at the location 40, device region 30 is narrowed from its designed dimension. This can cause a significant resistance to exist between the contact area 38 and the extremities of the diffused region 30 such as positions 42, 44. The distributed resistance between the contact 38 and the extremities 42, 44 can be of such magnitude as to effectively prevent the ends of the device from operating. This effect becomes apparent when the distributed resistance along the diffused region approaches the same order of magnitude as the operating channel resistance between source and drain.

Figure 2:
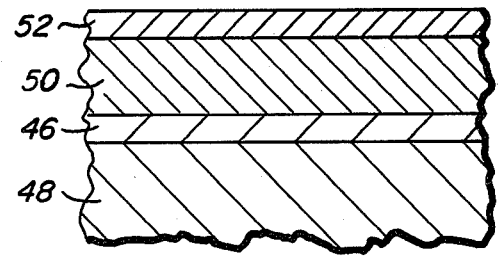

One embodiment of the process for the fabrication of the device in accordance with the invention which overcomes the above-identified problem is illustrated by the following description. The process is equally applicable to either N or P-channel devices, but will here be illustrated by describing the process for an N-channel device. The field region, that region surrounding the active device, can be prepared by any of the conventional techniques which are well known and need not be described here. FIG. 2 shows the result of the beginning steps in the process. A gate oxide layer 46 of clean, high quality silicon dioxide is thermally grown on a p-type silicon substrate 48. This silicon substrate is doped with boron to a resistivity of a few ohm-centimeter and the gate oxide has a thickness in the range of 50 to 100 nanometers. A layer of polycrystalline silicon 50, about 500 nanometers in thickness, is deposited over the gate oxide; and a second insulator layer such as silicon nitride 52, about 100 nanometers in thickness, is deposited over the polycrystalline silicon. The term polycrystalline is used to include amorphous or near amorphous as well as a truly polycrystalline structure. In some cases it may be desirable to deposit a very thin layer of oxide (not shown) on the polycrystalline silicon before depositing the silicon nitride. Depending on the exact processing that follows, this layer of oxide may aid in the eventual removal of the nitride layer.

Figure 3:
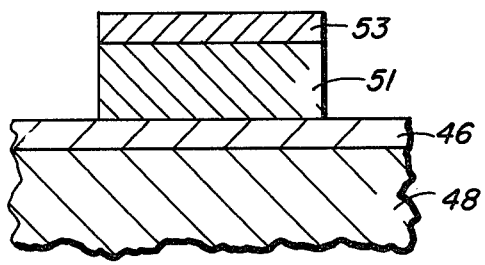

FIG. 3 shows the structure after the polycrystalline silicon and the silicon nitride have been patterned. The two layers are etched to form a stripe of polycrystalline silicon 51 about four micrometers in width, slightly wider than the width desired for the final gate electrode, overlaid by a stripe of silicon nitride 53. The silicon nitride and polycrystalline silicon can be patterned in a single etching operation; or, alternatively, the nitride can first be patterned and then subsequently used as a mask for patterning the polycrystalline silicon. In either case the nitride and polycrystalline silicon are patterned to have the same shape in the active device region.

Figure 4:
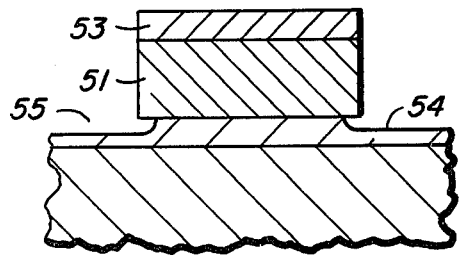

In accordance with the invention shown in FIG. 4, the gate oxide exposed by the previous patterning of the polycrystalline silicon is etched to reduce its thickness to the range of about 20-30 nanometers. The etching can conveniently and controllably be done using a dilute hydrofluoric acid etchant which does not appreciably etch the polycrystalline silicon or silicon nitride. After this etching step the gate oxide underlying the patterned polycrystalline silicon will be of the original thickness of 50 to 100 nanometers and the exposed oxide 54, 55 in the remaining portions of the active area will have a thickness of 20 to 30 nanometers.

In FIG. 5 the polycrystalline silicon is undercut etched to the final width desired for the gate electrode, about three micrometers. The etching is done by undercutting silicon nitride layer 53 which acts as a mask to protect the top of the polycrystalline silicon. The etching is done controllably in a potassium hydroxidewater-glycol mixture. During the etching of the polycrystalline silicon, the thin oxide layers 54, 55 protect the underlying silicon substrate from etching in the KOH etch mixture. The etching of polycrystalline silicon 51 proceeds uniformly from each side and the narrowed polycrystalline silicon is thus positioned a predetermined and uniform distance from the thinned oxide regions.

Nitride layer 53 is now removed as it serves no further function. The nitride is removed in an etchant such as hot phosphoric acid which etches silicon and silicon dioxide only slowly. The oxide layer, if used between the nitride and the polycrystalline silicon, precludes the formation of any difficult to etch silicon nitride-silicon complex at the interface. Polycrystalline silicon region 51 now serves as an ion implantation mask as shown in FIG. 6. Phosphorus or arsenic ions are implanted into the substrate 48 to form source and drain regions 56, 58 and simultaneously dope polycrystalline silicon 51. A sufficient implant energy is chosen to implant through the gate oxide regions which are not protected by the polycrystalline silicon. An implant dose of about $1 \times 10^{15}$ ions cm$^{-2}$ is adequate. The wafer is then heated to about 900° C. in a nitrogen ambient to activate and redistribute the implant. The thin oxide 54, 55 here serves the additional function of protecting the wafer surface from contamination and damage during this anneal step. After anneal, the source and drain regions are about one-half micrometer in depth and have a sheet resistivity of about 100 ohms per square. Without further processing, this high sheet resistance would lead to the above-described distributed resistance problems.

After the implant anneal, the gate oxide can again be etched in a dilute hydrofluoric acid etchant to remove the remaining thin oxide 54, 55, but to leave the unthinned gate oxide. This leaves a structure in accordance with the present invention having a narrow polycrystalline silicon gate electrode positioned equidistant from source and drain contact areas 60, 61. The contact areas are self-aligned with the gate electrode and require no photoresist alignment step. The contact areas are closely and precisely spaced about one-half micrometer from the gate electrode. Over this structure is deposited a silicide forming metal layer such as about 100 nanometers of platinum. The wafer is then heated to cause platinum silicide to form where the platinum contacts either the polycrystalline silicon gate electrode or the exposed portions of the silicon substrate. As shown by the hatching in FIG. 7, platinum silicide 62, 63 is formed in the contact areas 60, 61, respectively. These silicided regions are self aligned with the silicided region 64 of gate electrode 51. No reaction takes place between platinum and oxide and the platinum which overlies an oxide region is easily removed after the silicide formation. Details of wafer cleaning, metal deposition, silicide formation and metal removal after the formation are described, for example, in Kingzett et al, J. Electrochem. Soc., 122, 1729 (1975). The silicide reduces the sheet resistance of the gate electrode and the source and drain regions to about 3 ohms per square. This is far lower than the sheet resistance that could be achieved by increased doping, even by extremely heavy increased doping. As the silicide forms the platinum silicide "swells" to about twice the volume of the original platinum layer. It is the swelling of the platinum silicide that requires the offset between the gate electrode and the source and drain contacts. Without this offset the platinum silicide swelling would cause the shorting together of the three silicided regions.

FIG. 8 shows the completed device. Using conventional technology, low temperature protective glass 66 is deposited over the entire surface. This glass layer is patterned using conventional photolithography to form contact openings 68, 69 by means of which ohmic contact can be made to the silicided souce and drain regions. Aluminum or other metal is then deposited over the wafer and patterned to form ohmic contacts and interconnects as illustrated by the contacts 70, 71.

The process as illustrated above can be extended with only minor modifications to a complementary (CMOS) process. The term CMOS is here used because of its wide acceptance, but there is no implication that the process be restricted to those structures having an oxide gate insulator as opposed to any other acceptable type of insulator. The CMOS process is described without dwelling on any of the details of the process which are used in conventional CMOS. FIG. 9 shows an N-type substrate 72 in which a P-type tub 74 has been formed. A field oxide 76 has been patterned to define active device regions 78, 79 in the N and P-type regions respectively. A gate oxide 80 has been grown in each of these regions.

Figure 10:
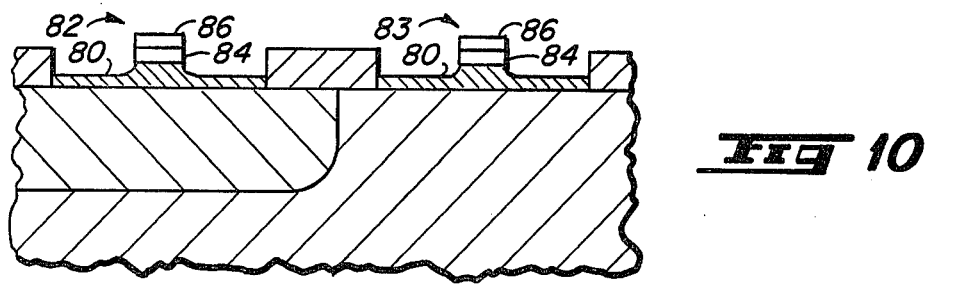

A layer of polycrystalline silicon and a layer of silicon nitride are sequentially deposited over the surface of the wafer. The polycrystalline silicon and silicon nitride are then patterned to form gate electrode structures 82, 83 in the active regions. Each of these gate structures consists of a polycrystalline stripe 84 overlaid by an identically shaped nitride region 86. In accordance with the invention shown in FIG. 10, these gate electrode structures are then used as a self-aligned etch mask for thinning exposed portions of the underlying gate oxide 80.

Figure 11:
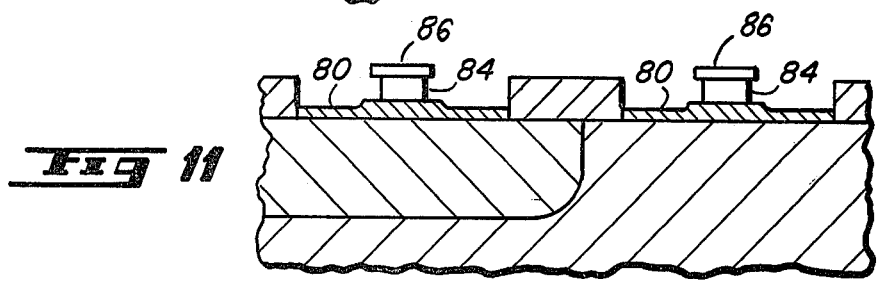

The patterned nitride region 86 is used as an undercut etch mask for narrowing the width of the patterned polycrystalline silicon region 84 of both of the gate electrode structures. This undercutting technique provides gate electrodes of the desired width which are self-aligned with a thinned gate oxide region as shown in FIG. 11. The polycrystalline silicon is narrowly spaced apart from and accurately positioned with respect to the thinned oxide regions. This is accomplished without the necessity of a photolithographical alignment.

Figure 12:
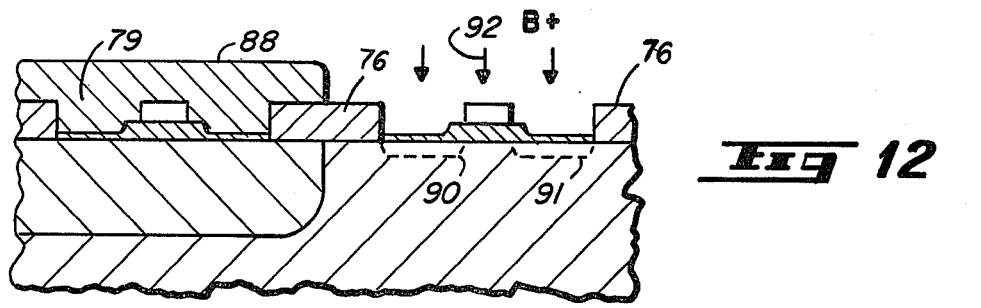

The nitride layer 86 can now be stripped from the wafer as it serves no further purpose. With the nitride removed the source and drain junction regions can be formed. The p-channel souce and drain regions are formed first, by using an easily aligned patterned layer of photoresist as an ion implantation mask. In FIG. 12 the patterned photoresist layer 88 is shown covering and protecting active area 79 from implantation. Using this photoresist layer, thick oxide 76 and the patterned and aligned polycrystalline silicon as a mask, source and drain regions 90, 91 are formed in the p-channel device by the implantation of boron ions as indicated by the arrows 92. Because the critical masking is done by the already patterned thick oxide and polycrystalline silicon, the photoresist pattern need not be of exacting tolerance nor alignment. The photoresist patterning should not, therefore, significantly affect the process yield. The implanted boron ions also dope the polycrystalline silicon and act to establish the correct gate-to-channel work function ($\phi_{MS}$). The work function is one of the determinant factors in establishing the threshold voltage of the device; without doping the polycrystalline silicon with boron ions, the subsequent formation of platinum silicide would result in a p-channel device having too high a threshold voltage. Photoresist layer 88 can then be stripped from the wafer and a new layer of photoresist similarly applied and patterned to cover and protect the p-channel devices and to allow, in like manner, for the ion implantation of phosphorus or arsenic ions to form the n-channel source and drain regions. Both p-type and n-type ion implantations are then annealed to activate the implants and to redistribute the implants to the desired junction depth.

Figure 13:
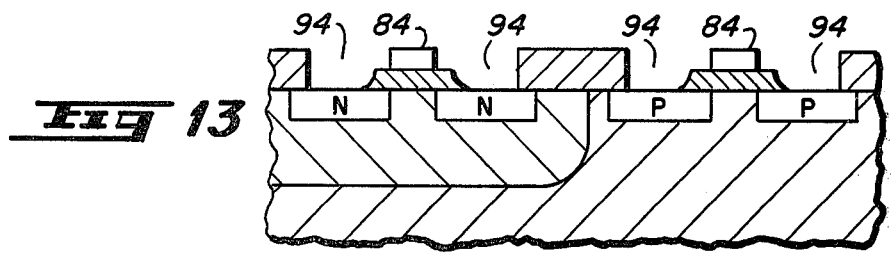

After annealing the ion implants, the previously thinned gate oxide 80 can be removed by etching in a dilute silicon dioxide etchant. The device, as shown in FIG. 13, is now ready for the application of a silicide-forming material. Narrow polycrystalline silicon electrodes 84, properly doped either n-type or p-type, are precisely spaced a small but carefully controlled distance from contact openings 94. After proper cleaning, a layer of platinum is applied to the wafer and platinum silicide is formed, as described above, in contact regions 94 and in the polycrystalline silicon gate electrodes.

Figure 14:
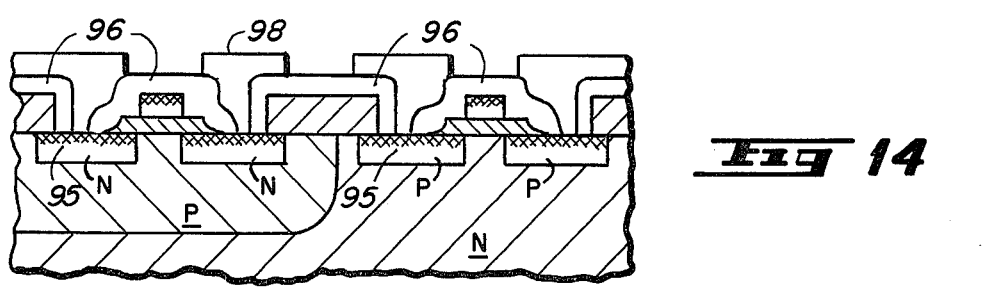

The completed device structure is shown in FIG. 14. The silicided contacts to source and drain regions and the silicided gate electrode are shown at 95 by the cross hatching. A layer of passivating glass 96 is deposited over the structure and patterned to allow ohmic contact to the silicided regions. A layer of interconnecting aluminum or aluminum alloy is then deposited and patterned to interconnect device regions in a particular circuit configuration and to provide off-chip communication.

There is thus provided by the present invention an improved insulated gate field effect transistor wherein the use of the gate electrode, in two widths, as a mask enables smaller devices to be made. The protruding insulating layer, underlying the narrowed gate, better isolates the gate from the source and drain, enabling one to form silicided contacts without shorting the gate to either the source or the drain, despite the attendant swelling or the silicide. The contacts and gate electrodes are closely spaced yet electrically separate to provide minimum device sizing. The silicided contacts provide low resistance source and drain regions without necessitating extremely large nor extremely heavily doped source and drain regions. The reduced size and reduced resistance provide lower RC time constants, enhancing performance. The resulting low resistance diffused areas as well as the low resistance gate electrodes can be used for device interconnects, providing two more layers of high conductivity interconnect in addition to the final metal layer which is applied to complete the device.

While this improved structure and method have been described in terms of preferred embodiments, it is evident that many alternatives, modifications, and variations will be apparent to those skilled in the art within the spirit and scope of the present invention. These include, for example, the recognition that the process may be applied to the fabrication of either N- or P-channel devices, that other insulators besides silicon dioxide and silicon nitride can be employed, that diffusion can be substituted for ion implantation and that other materials such as palladium and hafnium can be substituted for platinum. Accordingly, it is intended that the invention embrace all such alternatives, modifications, and variations.

We claim:

1. In a process for the self-aligned fabrication of semiconductor devices having a gate electrode overlying an insulating layer and wherein said gate electrode is patterned to define areas in a substrate in which contacts are to be formed, the improvement comprising the following steps in the order given: thinning said insulating layer overlying said areas as defined by said gate using said gate as a mask; reducing the width of said gate between said areas to expose full thickness portions of said insulating layer; doping said substrate using said reduced width gate as a mask to form source and drain regions self-aligned with said reduced width gate; and removing the thinned portion of said insulating layer to form contact regions to said source and drain regions, said contact regions self-aligned with and spaced from said reduced width gate.

2. The process of claim 1 further comprising the steps of: depositing a layer of silicide forming metal over said devices; heating to form metal silicide contacts to said contact regions.

3. The process of claim 2 further comprising the step of forming a metal silicide gate electrode.

4. The process of claim 2 wherein said layer of silicide forming metal is a layer of platinum.

5. A self-aligned process for fabricating a semiconductor device which comprises the steps of: providing a silicon substrate of a first conductivity type having a surface; forming a first insulator on said surface; depositing a layer of silicon material overlying said first insulator; forming a second insulator overlying said silicon material; patterning said second insulator and said silicon material to form a region of silicon material overlaid by a similarly shaped region of said second insulator, said patterning exposing a portion of said first insulator; thinning said exposed portion of said first insulator using said region of silicon material as an etch mask; etching said region of silicon material in an etchant which etches said silicon material more rapidly than said second insulator to provide a region of said silicon material narrower than said region of said second insulator and spaced apart from and in alignment with said thinned portion of said first insulator; removing said second insulator in an etchant which etches said second insulator more rapidly than said first insulator or said silicon material; applying impurities to said substrate using said region of semiconductor material as a mask to form device regions of a second conductivity type; etching said thinned portion of said first insulator to expose portions of said semiconductor substrate of said second conductivity type; depositing a silicide forming material and heating to form a metal silicide with said silicon material and with said silicon substrate.

6. A process for fabricating a semiconductor device which comprises the steps in the order given of: providing a silicon substrate; thermally growing a layer of oxide on said substrate; forming a region of silicon material on said layer of oxide, said region leaving exposed portions of said layer of oxide; thinning but not totally removing said exposed portions of said layer of oxide using said region of silicon material as a mask, said layer of oxide after said step of thinning having a portion of original thickness underlying said silicon material and a thinned portion adjacent said silicon material; etching said region of silicon material to decrease the width thereof, the edge of the etched silicon material displaced a lateral distance from the thinned portion of said oxide layer; implanting conductivity determining ions into said substrate and into said silicon material using said decreased width silicon material as an implant mask; removing said thinned portion of said oxide layer to expose a portion of said substrate; applying a layer of silicide forming metal overlying said substrate and contacting said silicon material and said exposed portion of said substrate; heating to form metal-silicide contacts at said exposed portion of said substrate and to form metal silicide at said silicon material region, said contacts spaced apart from and self-aligned with said silicon material region.

7. A self aligned process for fabricating complementary insulated gate field effect devices in a silicon substrate which comprises the steps of: providing a polycrystalline silicon gate electrode overlying a layer of gate insulator for each of said complementary devices; thinning portions of said layer of gate insulator using said gate electrodes as masks; reducing the width of said gate electrodes to produce narrow polycrystalline electrodes aligned between areas of thinned gate insulator; selectively doping said substrate with dopant impurities of a first conductivity type using a first of the narrowed gate electrodes as a mask to form self aligned source and drain regions; selectively doping said substrate with dopant impurities of a second conductivity type using a second of the narrowed gate electrodes as a mask to form source and drain regions of said second conductivity type; and removing the thinned layer of said gate insulator.

8. The process of claim 7 wherein said steps of doping said substrate also dope the masking gate electrode.

9. The process of claim 7 further comprising the steps of applying a silicide forming metal layer to said devices; heating said metal layer to form silicide contacts to said source and drain regions.

* * * * *